US012677627B2

(12) United States Patent
    Kim et al.

(10) Patent No.:  US 12,677,627 B2
(45) Date of Patent:      Jul. 7, 2026

(54) SUBSTRATE PROCESSING SYSTEM AND PROCESS GAS SUPPLY CONTROL VERIFICATION METHOD

(71) Applicant: SEMES CO., LTD., Cheonan-si (KR)

(72) Inventors: Tae Sung Kim, Cheonan-si (KR); Duk Hyun Son, Cheonan-si (KR); Kwang Pyo Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 13 days.

(21) Appl. No.: 18/607,481

(22) Filed: Mar. 17, 2024

(65) Prior Publication Data

US 2025/0029851 A1      Jan. 23, 2025

(30) Foreign Application Priority Data

Jul. 19, 2023    (KR) ........................ 10-2023-0093702

(51) Int. Cl.
    *H10P 72/00*        (2026.01)
    *B08B 9/032*        (2006.01)
(52) U.S. Cl.
    CPC ........ *H10P 72/0604* (2026.01); *B08B 9/0325* (2013.01); *B08B 9/0328* (2013.01); *H10P 72/0402* (2026.01); *B08B 2209/032* (2013.01)

(58) Field of Classification Search
    CPC ......... H01L 21/67253; H01L 21/67017; B08B 9/0325; B08B 9/0328; B08B 2209/032; H01J 37/3244; H01J 37/32449; H01J 37/32798
    See application file for complete search history.

(56) References Cited

U.S. PATENT DOCUMENTS

| | | | |
|---|---|---|---|
| 4,341,107 A | * | 7/1982 | Blair ........................ G01F 1/76 |
| | | | 73/195 |
| 7,979,165 B2 | | 7/2011 | Gotoh et al. |
| 10,788,356 B2 | | 9/2020 | Amikura et al. |
| 2012/0024054 A1 | * | 2/2012 | Huang .................. G01F 1/6845 |
| | | | 73/204.26 |

FOREIGN PATENT DOCUMENTS

| | | | | |
|---|---|---|---|---|
| CN | 1829903 A | * | 9/2006 | ............. G01F 25/10 |
| JP | 2635929 | | 10/1995 | |
| KR | 1372976 | | 3/2014 | |
| KR | 2018-0030447 | | 3/2018 | |

* cited by examiner

*Primary Examiner* — Tung S Lau

(57) ABSTRACT

Proposed are a substrate processing system and a process gas supply control verification method and, more particularly, to a technology to verify the operation of a mass flow controller (MFC) that supplies a process gas for semiconductor processing at an appropriate flow rate according to a recipe.

12 Claims, 12 Drawing Sheets

FIG. 5

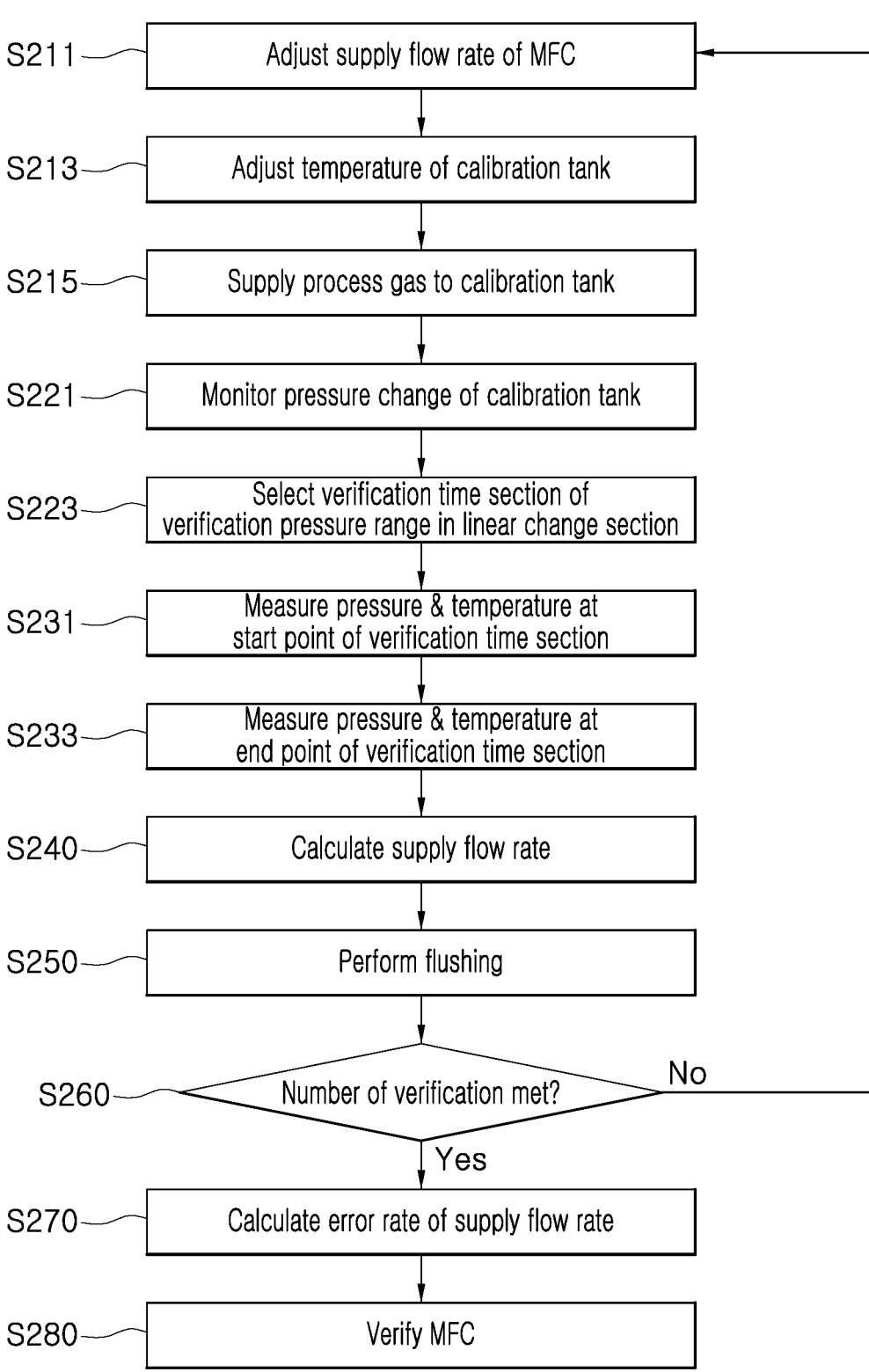

S211 — Adjust supply flow rate of MFC

S213 — Adjust temperature of calibration tank

S215 — Supply process gas to calibration tank

S221 — Monitor pressure change of calibration tank

S223 — Select verification time section of verification pressure range in linear change section S231 — Measure pressure & temperature at start point of verification time section S233 — Measure pressure & temperature at end point of verification time section S240 — Calculate supply flow rate S250 — Perform flushing S260 — Number of verification met?        No Yes S270 — Calculate error rate of supply flow rate S280 — Verify MFC

S310 — Select process gas

S320 — Select supply flow rate

S330 — Adjust supply flow rate of MFC

S340 — Supply process gas

S350 — Verify MFC for selected supply flow rate

S360 — Change of supply flow rate needed?    Yes

No

S370 — Determine operating status of MFC

SUBSTRATE PROCESSING SYSTEM AND PROCESS GAS SUPPLY CONTROL VERIFICATION METHOD

CROSS REFERENCE TO RELATED APPLICATION

The present application claims priority to Korean Patent Application No. 10-2023-0093702, filed Jul. 19, 2023, the entire contents of which is incorporated herein for all purposes by this reference.

BACKGROUND OF THE INVENTION

Field of the Invention

The present disclosure relates to a substrate processing system and a process gas supply control verification method and, more particularly, to a technology to verify the operation of a mass flow controller (MFC) that supplies a process gas for semiconductor processing at an appropriate flow rate according to a recipe.

Description of the Related Art

In semiconductor manufacturing, various process gases are supplied to a substrate processing apparatus to perform a process. A mass flow controller (MFC) is deployed to precisely control the flow of process gases in semiconductor manufacturing processes such as etching, chemical vapor deposition, diffusion, metallization, and cleaning.

The MFC can precisely control the supply flow rate by detecting changes in gas pressure depending on the supply pressure of a process gas and environmental conditions.

However, because the supply of process gases relies on MFCs, if an MFC does not operate accurately, the supply flow rate of a process gas cannot be controlled accurately according to the process conditions, resulting in defective products.

Accordingly, when supplying a process gas to a substrate processing apparatus, it is necessary to determine the supply flow rate of a process gas supplied through an MFC and verify that the process gas is supplied at an appropriate flow rate set for the corresponding process.

In MFC verification, verifying low flow rates of less than 10 sccm takes quite a long time.

In particular, in the case of a metal gas, verifying the supply flow rate is difficult due to temperature sensitivity of the metal gas and a residual metal gas.

SUMMARY OF THE INVENTION

Accordingly, the present disclosure has been made keeping in mind the above problems occurring in the related art, and an objective of the present disclosure is to provide a method for verifying supply control of a process gas supplied to a substrate processing apparatus.

In particular, an objective of the present disclosure is to solve the problem of taking quite a long time to verify low flow rates of less than 10 sccm in MFC verification, and the problem of difficulty verifying a supply flow rate in the case of a metal gas due to temperature sensitivity of the metal gas and a residual metal gas.

The objective of the present disclosure is not limited to the above, and other objectives and advantages of the present disclosure not mentioned may be understood by the following description.

In order to accomplish the above objectives, according to an embodiment of the present disclosure, there is provided a process gas supply control verification method, the method including: a process gas supply step of supplying a process gas by adjusting a supply flow rate of the process gas with a mass flow controller, and supplying the process gas to a calibration tank through a bypass gas supply line; a verification section selection step of selecting a verification time section while changing a state of the calibration tank through process gas supply; a changing state measurement step of measuring the changing state of the calibration tank in the verification time section; and a supply flow rate calculation step of calculating a supply flow rate of the process gas on the basis of the measurement of the changing state of the calibration tank.

Preferably, in the verification section selection step, a verification time section of a verification pressure range may be selected in a section where pressure in the calibration tank changes linearly according to the process gas supply.

As an example, in the changing state measurement step, pressure and temperature of the calibration tank may be measured in the verification time section.

As an example, in the supply flow rate calculation step, the supply flow rate of the process gas supplied through the mass flow controller may be calculated considering volume of the calibration tank and volume of the bypass gas supply line on the basis of a pressure change and a temperature change in the calibration tank at start and end points of the verification time section.

As an example, in the supply flow rate calculation step, the supply flow rate may be calculated using [Equation 1] below, $$\text{flow}(sccm) = \alpha \cdot \frac{273.15}{(273.15 + C)} \cdot \frac{(V_t + V_p)}{760,000} \cdot \left( \frac{P_2 - P_1}{T_2 - T_1} - \text{Leak} \right) \quad \text{[Equation 1]}$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank.

Furthermore, the volume of the bypass gas supply line may be calculated on the basis of pressure and temperature of the process gas supplied through the bypass gas supply line.

As an example, the process gas may be a metal gas.

Furthermore, in the process gas supply step, the process gas may be supplied to the calibration tank while a temperature of the calibration tank is controlled through a temperature control means and maintained at a set temperature.

As an example, in the process gas supply step, a process gas supplied to the process gas supply line connected to a selected process chamber among a plurality of process chambers may be diverted to the bypass gas supply line and supplied to the calibration tank.

As an example, in the process gas supply step, the process gas supplied through a mass flow controller selected from among a plurality mass flow controllers connected to a plurality of gas source parts may be diverted to the bypass gas supply line and supplied to the calibration tank.

Preferably, the method may further include: a cleaning step of supplying a purge gas to the bypass gas supply line to flush the bypass gas supply line and the calibration tank.

Furthermore, the method may further include: a mass flow controller verification step of repeatedly performing the process gas supply step to the cleaning step to calculate an error rate for the supply flow rate and verify the mass flow controller.

More preferably, the method may further include: a mass flow controller operation determination step of performing the process gas supply step and the mass flow controller verification step by changing the supply flow rate to be verified to verify the mass flow controller for each supply flow rate to be verified and determine whether the mass flow controller operates normally.

In addition, a substrate processing system according to an embodiment of the present disclosure may include: a mass flow controller configured to control a supply flow rate of a process gas supplied to a process chamber; a process gas supply line configured to supply a process gas whose supply flow rate is controlled by the mass flow controller to the process chamber; a bypass gas supply line configured to divert a process gas supplied to the process gas supply line through the mass flow controller; a calibration tank configured to store a process gas supplied through the bypass gas supply line; a measuring instrument configured to measure a changing state of the calibration tank; an exhaust means for exhausting a process gas from the calibration tank; a cleaning means for supplying a purge gas to the bypass gas supply line to clean the bypass gas supply line and the calibration tank; and a flow calculator configured to select a verification time section on the basis of the changing state of the calibration tank, and calculate a supply flow rate of a process gas supplied through the mass flow controller on the basis of changing state measurements of the calibration tank in the verification time section.

Preferably, the system may further include: a bypass control valve disposed in the bypass gas supply line to control supply of a process gas supplied to the calibration tank; and a controller configured to control the bypass control valve to selectively regulate supply of a process gas to the calibration tank, control the exhaust means to regulate discharge of a process gas from the calibration tank, and control the cleaning means to regulate cleaning of the bypass gas supply line and the calibration tank.

Furthermore, the measuring instrument may include: a pressure gauge for measuring pressure in the calibration tank; and a thermometer for measuring a temperature of a process gas in the calibration tank.

As an example, the system may further include: a plurality of process gas source parts; and a plurality of mass flow controllers for each of the plurality of gas source parts to control a supply flow rate of a process gas, wherein the bypass gas supply line may divert a process gas supplied to the process gas supply line through a mass flow controller selected from among the plurality of mass flow controllers.

As an example, the system may further include: a temperature control means for controlling the temperature of the calibration tank, wherein the controller may control the temperature control means to adjust the temperature of the calibration tank and maintain the temperature of the calibration tank at a set temperature.

As an example, the flow calculator may calculate the supply flow rate using [Equation 1] below, $$\text{flow}(sccm) = \alpha \cdot \frac{273.15}{(273.15 + C)} \cdot \frac{(V_t + V_p)}{760,000} \cdot \left(\frac{P_2 - P_1}{T_2 - T_1} - \text{Leak}\right) \quad \text{[Equation 1]}$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank.

According to an embodiment of the present disclosure, there is provided a process gas supply control verification method, the method including: a process gas supply step of supplying a metal gas by adjusting a supply flow rate of the metal gas to a supply flow rate to be verified through a mass flow controller, and supplying the metal gas to a calibration tank through a bypass gas supply line; a verification section selection step of detecting pressure changes while increasing pressure of the calibration tank through metal gas supply, and selecting a verification time section of a verification pressure range set in response to the supply flow rate to be verified in a pressure section that changes linearly; a flow rate calculation step of calculating a supply flow rate of the metal gas by substituting pressure measurements and a temperature measurement in the verification time section into [Equation 1] below, $$\text{flow}(sccm) = \alpha \cdot \frac{273.15}{(273.15 + C)} \cdot \frac{(V_t + V_p)}{760,000} \cdot \left(\frac{P_2 - P_1}{T_2 - T_1} - \text{Leak}\right) \quad \text{[Equation 1]}$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank; a cleaning step of supplying a purge gas to the bypass gas supply line to flush the bypass gas supply line and the calibration tank; a mass flow controller verification step of repeatedly performing the process gas supply step to the cleaning step to calculate an error rate for the supply flow rate and verify the mass flow controller; and a mass flow controller operation determination step of performing the process gas supply step and the mass flow controller verification step by changing the supply flow rate to be verified to verify the mass flow controller for each supply flow rate to be verified and determine whether the mass flow controller operates normally.

According to the present disclosure, a supply flow rate of a mass flow controller (MFC) can be verified for low flow process gases, especially a metal gas.

In particular, accurate verification of a mass flow controller for low flow rates of less than 10 sccm is possible in a short time, ensuring reproducibility and reliability of process gas supply.

In addition, in the case of a metal gas, the problem of difficulty verifying a supply flow rate due to temperature sensitivity of the metal gas and a residual metal gas can be solved.

Furthermore, it is not easy to accurately measure a supply flow rate of a mass flow controller through a conventional chamber, and a fairly long time is required for precise verification. However, in the present disclosure, after selecting a section where a flow rate can be calculated in a section where pressure changes linearly in response to the type and flow rate of a relevant process gas, a supply flow rate is calculated on the basis of measurements of a changing state of a calibration tank in the corresponding section, and thus accurate flow rate calculation is possible in a short time.

The effects of the present disclosure are not limited to those mentioned above, and other effects not mentioned will be clearly understood by those skilled in the art from the description below.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 5 shows a flowchart of an embodiment of verifying a mass flow controller through repetitive supply flow calculation in a process gas supply control verification method according to the present disclosure;

FIG. 6 shows an example of an operation for calculating a supply flow rate by bypass supplying a process gas to a calibration tank in a process gas supply control verification method according to the present disclosure;

FIG. 8 shows an example of cleaning a calibration tank and a bypass gas supply line in a process gas supply control verification method according to the present disclosure;

DETAILED DESCRIPTION OF THE INVENTION

Hereinafter, preferred embodiments of the present disclosure will be described in detail with reference to the accompanying drawings. However, the present disclosure is not limited by the embodiments.

In order to explain the present disclosure, the operational advantages of the present disclosure, and the objectives achieved by the practice of the present disclosure, preferred embodiments of the present disclosure are exemplified and referenced herein.

First, the terms used in this application are only used to describe specific embodiments, and are not intended to limit the present disclosure, and the singular expression may include a plural expression unless the context clearly indicates otherwise. In addition, it should be understood that in the present disclosure, terms such as "comprise" and "have" are intended to designate that a feature, number, step, operation, component, part, or combination thereof described in the specification exists, and do not preclude the possibility of addition or existence of one or more other features or numbers, steps, operations, components, parts, or combinations thereof.

In describing the present disclosure, when it is determined that a detailed description of a related known configuration or function may obscure the gist of the present disclosure, the detailed description thereof will be omitted.

The present disclosure proposes a technology to verify the operation of a mass flow controller (MFC) that supplies a process gas for semiconductor processing at an appropriate flow rate according to a recipe.

Figure 1A:
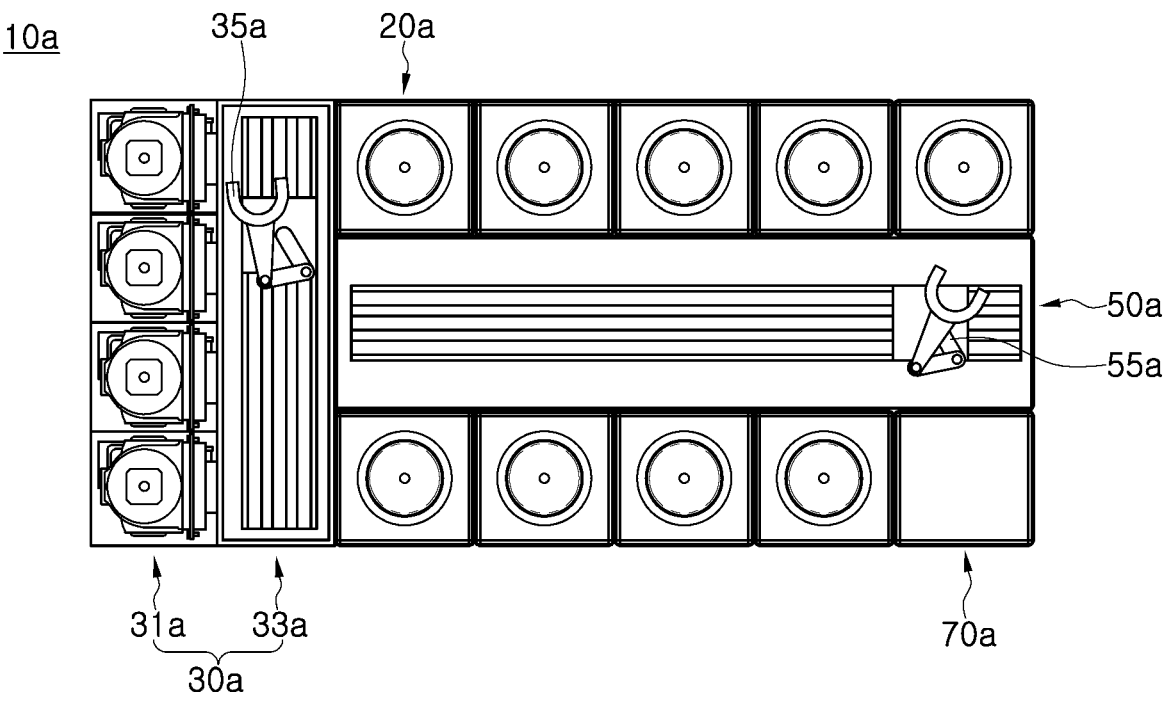
FIGS. 1A to 1C show an embodiment of a substrate processing system to which the present disclosure is applied.
Figure 1B:
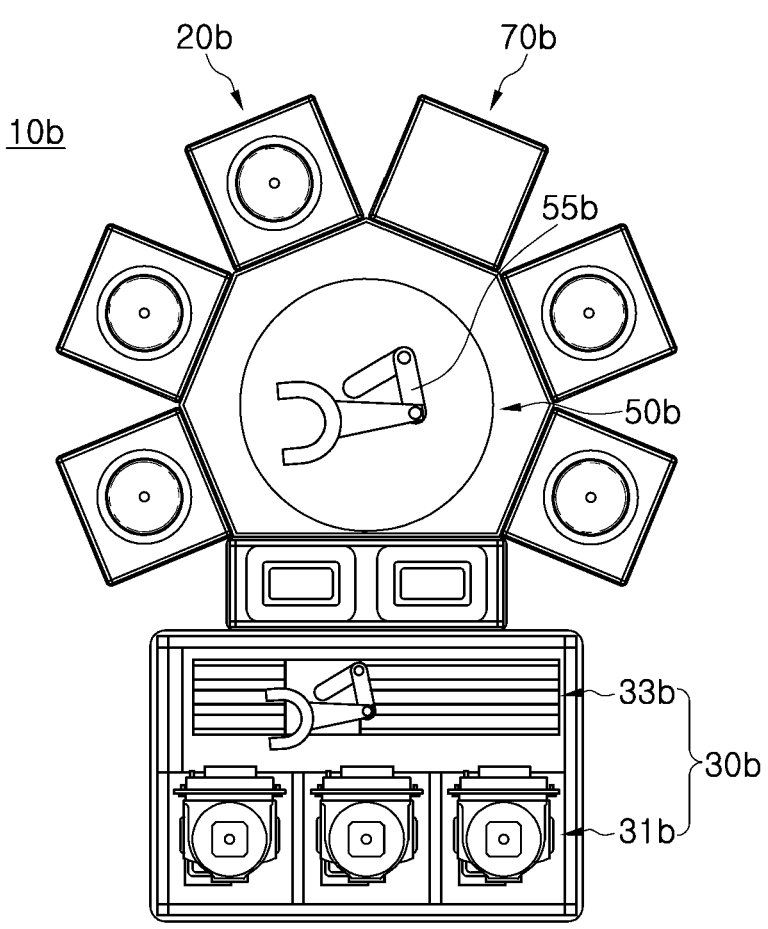
Figure 1C:
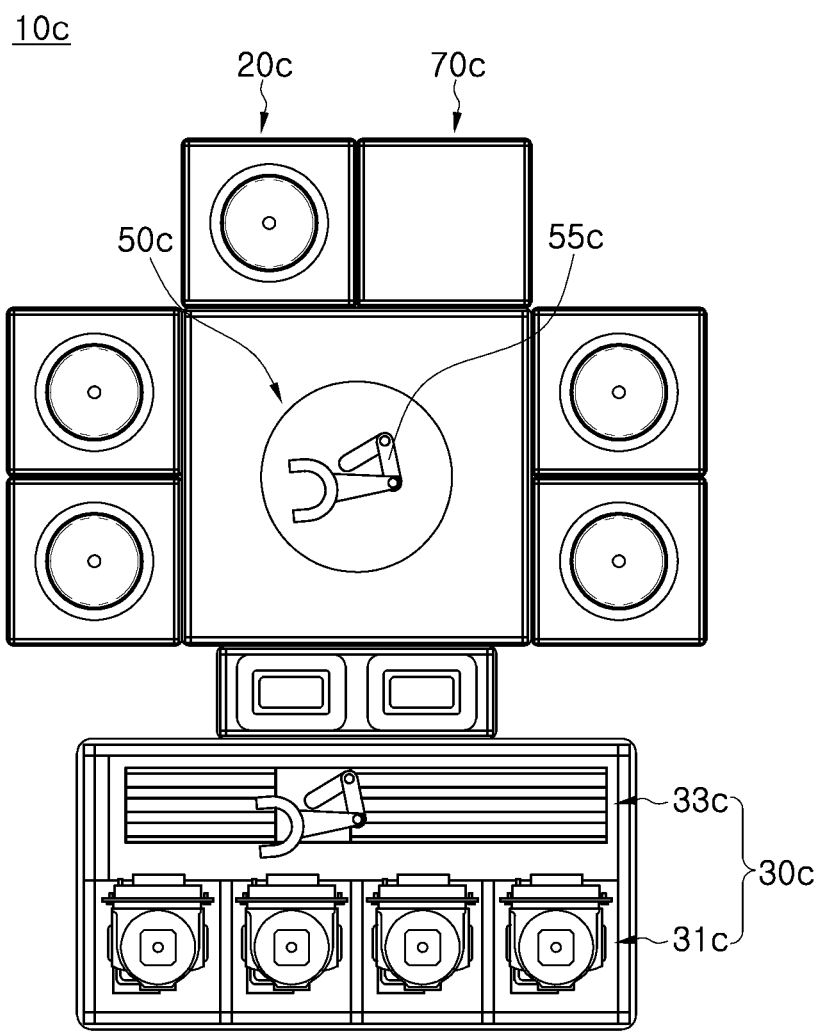

FIGS. 1A to 1C show an embodiment of a substrate processing system to which the present disclosure is applied.

A substrate processing system 10a, 10b, or 10c may include a process chamber 20a, 20b, or 20c, a supply flow verification device 70a, 70b, or 70c, a substrate transfer device 50a, 50b, or 50c, and an index module 30a, 30b, or 30c.

As one of many examples of substrate processing systems, the form shown in FIG. 1A in which a plurality of process chambers 20a for performing a substrate processing process are arranged on both sides of the substrate transfer device 50a along the longitudinal direction will be referred to as a hyperspace type.

In addition, the form shown in FIG. 1B in which a plurality of process chambers 20b for performing a substrate processing process are arranged along the circumference direction of the substrate transfer device 50b will be referred to as a cluster type.

In addition, the form shown in FIG. 1C in which a plurality of process chambers 20c for performing a substrate processing process are arranged on the left, right, and upper sides of the substrate transfer device 50c will be referred to as a puritas type.

The substrate transfer device 50a, 50b, or 50c may include a transfer robot 55a, 55b, or 55c that selectively transfers substrates to the plurality of process chambers 20a, 20b, or 20c.

The index module 30a, 30b, or 30c may include a load port 31a, 31b, or 31c, and a transfer frame 33a, 33b, or 33c.

A carrier accommodating a substrate W may be seated in the load port 31a, 31b, or 31c. The number of load port 31a, 31b, or 31c may vary depending on substrate processing efficiency, production efficiency, etc. As an example, a front opening unified pod (FOUP) may be used as a carrier. A slot may be formed inside the carrier to horizontally accommodate a plurality of substrates W.

The process chamber 20a, 20b, or 20c may be a diverse device that performs a relevant substrate processing process such as etching, deposition, diffusion, metallization, and cleaning, using process gas.

A process gas supply device (not shown) that supplies a process gas to each process chamber 20a, 20b, or 20c may be included. The process gas supply device may adjust supply flow rate of a process gas to a set supply flow rate in response to a corresponding substrate process and supply the process gas to each process chamber 20a, 20b, or 20c.

The supply flow verification device 70a, 70b, or 70c may verify whether the process gas supply device supplies a process gas by adjusting a supply flow rate of the process gas to a required supply flow rate according to a corresponding process.

The supply flow verification device 70a, 70b, or 70c will be described in more detail later through examples.

As described above, the substrate processing system 10a, 10b, or 10c may have the plurality of process chambers 20a, 20b, or 20c arranged in various forms with respect to the substrate transfer device 50a, 50b, or 50c, and in addition to the arrangement structures shown in 1A to 1C, various modified forms are possible. Although in the present embodiment, the supply flow verification device 70a, 70b, or 70c is shown as arranged in correspondence with the arrangement of the plurality of process chambers 20a, 20b, or 20c, depending on the situation, the supply flow verification device 70a, 70b, or 70c may be placed in a separate location away from the process chamber 20a, 20b, or 20c.

Furthermore, although in the present embodiment, the substrate processing system 10a, 10b, or 10c consisting of the plurality of process chambers 20a, 20b, or 20c is shown and described as an example, the present disclosure may also be applied to a substrate processing system designed to perform substrate processing processes by a single process chamber.

Figure 2:
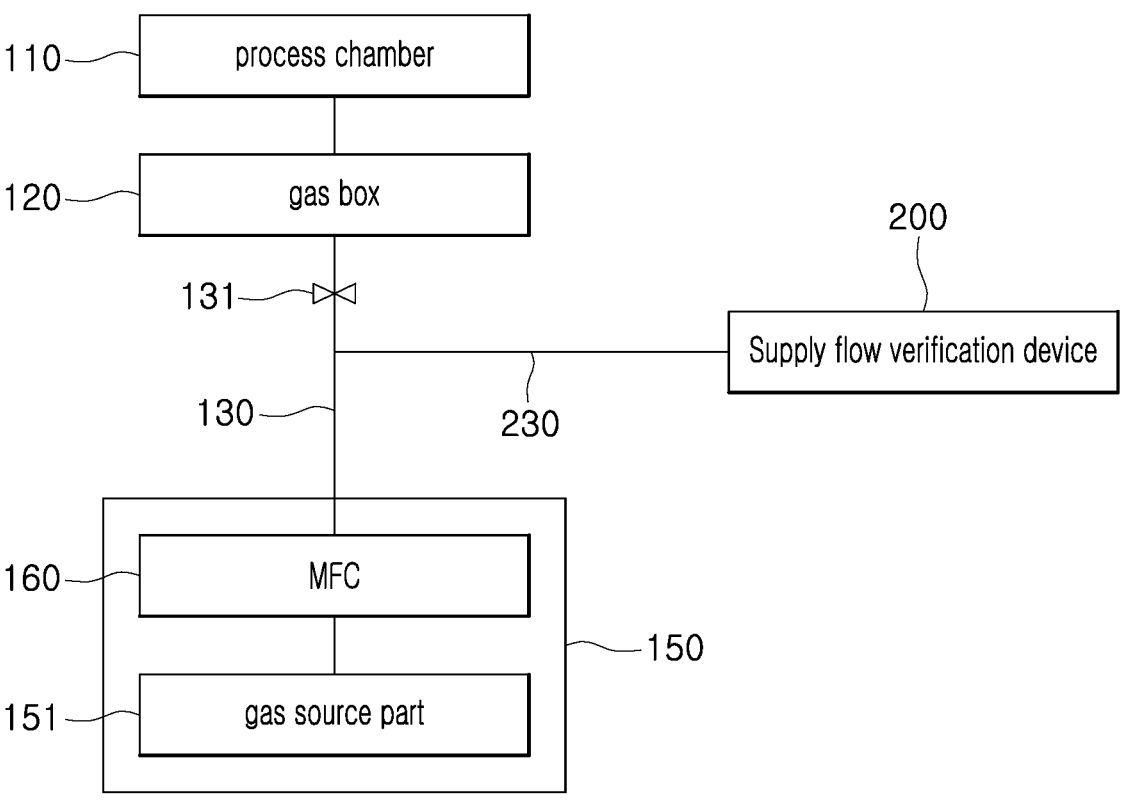
FIG. 2 shows a schematic diagram of a substrate processing system with a supply flow verification device according to the present disclosure.

FIG. 2 shows a schematic diagram of a substrate processing system with a supply flow verification device according to the present disclosure.

A substrate processing system 100 may include: a process chamber 110; a process gas supply device 150 that supplies a process gas to the process chamber 110 by adjusting the flow rate; and a supply flow verification device 200 that verifies the supply flow rate of the process gas supplied from the process gas supply device 150.

The process gas supply device 150 may include: a gas source part 151 that supplies a process gas; and a mass flow controller (MFC) 160 that controls the flow rate of the process gas supplied from the gas source part 151.

The process gas supply device 150 may adjust the supply flow rate of a process gas and provide the process gas to a process gas supply line 130. A gas supply control valve 131 is disposed on the process gas supply line 130 to selectively control the supply of a process gas supplied through the process gas supply line 130.

A process gas may be supplied to the process chamber 110 through the process gas supply line 130. As an example, the process gas supply line 130 supplies a process gas to a gas box 120 disposed correspondingly to the process chamber 110, and the process gas may be supplied to the process chamber 110 through the gas box 120.

The supply flow verification device 200 may verify the supply flow rate of a process gas supplied from the process gas supply device 150.

As an example, the supply flow verification device 200 may calculate a supply flow rate by diverting a process gas supplied to the process gas supply line 130 with the supply flow rate of the process gas adjusted by the MFC 160, and verify the operating status of the MFC 160 on the basis of the calculated supply flow rate.

Figure 3:
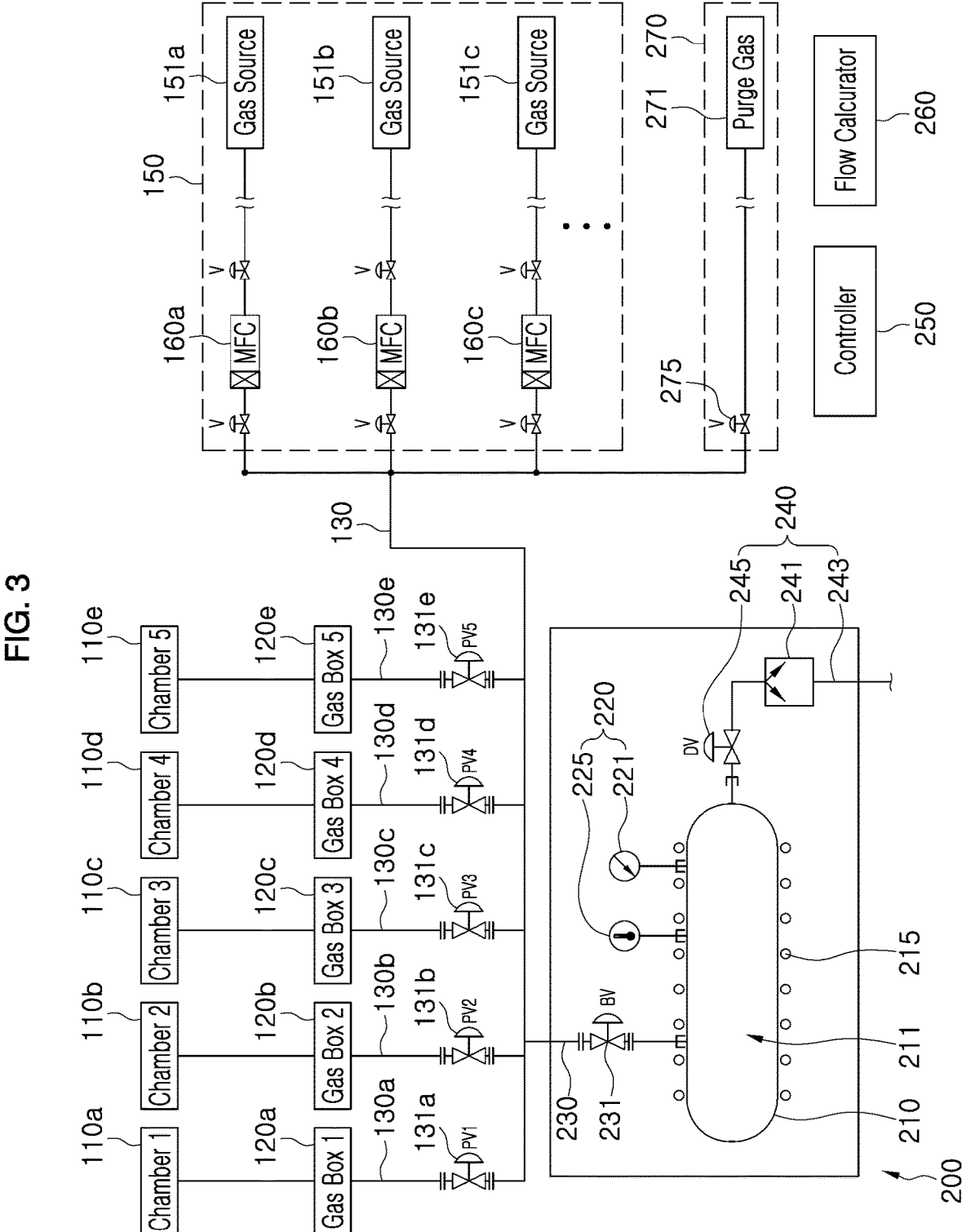
FIG. 3 shows an embodiment of a supply flow verification device in a substrate processing system according to the present disclosure.

FIG. 3 shows an embodiment of a supply flow verification device in a substrate processing system according to the present disclosure.

The process gas supply device 150 may include gas source parts 151a, 151b, and 151c, and the MFCs 160a, 160b, and 160c.

The process gas supply device 150 may include a plurality of gas source parts 151a, 151b, and 151c. The gas source parts 151a, 151b, and 151c hold and supply process gases, and the gas source parts 151a, 151b, and 151c may supply different process gases or the same process gas.

The MFCs 160a, 160b, and 160c are disposed in response to the respective gas source parts 151a, 151b, and 151c, and the MFCs 160a, 160b, and 160c may adjust the supply flow rate of a process gas supplied from the gas source parts 151a, 151b, and 151c according to relevant process conditions.

The process gas with the supply flow rate adjusted by the MFCs 160a, 160b, and 160c is supplied to the process gas supply line 130. The process gas supply line 130 is connected to individual process gas supply lines 130a, 130b, 130c, 130d, and 130e branched from the process gas supply line 130 in response to individual process chambers 110a, 110b, 110c, 110d, and 110e.

Gas supply control valves 131a, 131b, 131c, 131d, and 131e are disposed on the individual process gas supply lines 130a, 130b, 130c, 130d, and 130e so that a process gas may be selectively supplied to each individual process gas supply line 130a, 130b, 130c, 130d, or 130e The individual process gas supply lines 130a, 130b, 130c, 130d, and 130e supply a process gas to gas boxes 120a, 120b, 120c, 120d, and 120e provided for the process chambers 110a, 110b, 110c, 110d, and 110e, respectively, and a relevant process gas may be supplied to each of the process chambers 110a, 110b, 110c, 110d, and 110e through the gas boxes 120a, 120b, 120c, 120d, and 120e.

The supply flow verification device 200 may verify the supply flow rate of a process gas supplied through the MFCs 160a, 160b, and 160c.

The supply flow verification device 200 may include a calibration tank 210, a measuring instrument 220, a bypass gas supply line 230, an exhaust means 240, a cleaning means 270, a controller 250, and a flow calculator 260.

The bypass gas supply line 230 is connected to the middle of the process gas supply line 130, and may divert a process gas supplied through the process gas supply line 130 and supply the diverted process gas to the calibration tank 210.

A bypass control valve 231 is disposed in the bypass gas supply line 230 to control the supply of a process gas supplied to the calibration tank 210 through the bypass gas supply line 230.

The calibration tank 210 has a gas storage space 211 of a set volume and may store the supplied process gas in the gas storage space 211. The internal state of the calibration tank 210 may change depending on the supply of a process gas. For example, the pressure, temperature, etc. of the calibration tank 210 may change depending on the supply of a process gas.

The measuring instrument 220 may measure a changing state of the calibration tank 210. As an example, the measuring instrument 220 may include a pressure gauge 221 to measure changes in internal pressure of the calibration tank 210. As an example, the measuring instrument 220 may include a thermometer 225 to measure changes in internal temperature of the calibration tank 210.

The calibration tank 210 may be provided with a temperature control means 215 to control the temperature of the calibration tank 210.

As an example, the temperature control means 215 may include a coil surrounding the calibration tank 210 and control the temperature of the calibration tank 210 by heating the coil.

The exhaust means 240 is connected to the calibration tank 210 so that the process gas in the calibration tank 210 may be discharged to the outside. The exhaust means 240 may include an exhaust line 243 connected to the calibration tank 210, and an exhaust valve 245 and an exhaust pump 241 that selectively control gas flow in the exhaust line 243.

The cleaning means 270 may perform flushing of the calibration tank 210 and the bypass gas supply line 230. Furthermore, the cleaning means 270 may perform flushing of the process gas supply line 130, the individual process gas supply lines 130a, 130b, 130c, 130d, and 130e, and the gas boxes 120a, 120b, 120c, 120d, and 120e.

The cleaning means 270 may include a purge gas source part 271, and a purge gas control valve 275.

The purge gas source part 271 may hold and supply an inert gas, etc. as a cleaning gas. The purge gas source part 271 may supply a purge gas by means of the purge gas control valve 275 to perform flushing of the calibration tank 210 and the bypass gas supply line 230.

The controller 250 may control each MFC 160a, 160b, and 160c to set the supply flow rate of a process gas, and may control the gas supply control valves 131a, 131b, 131c, 131d, and 131e to selectively supply the process gas supplied through the process gas supply line 130 to the individual process gas supply lines 130a, 130b, 130c, 130d, and 130e.

The controller 250 may control the bypass control valve 231 to divert a process gas supplied through the process gas supply line 130 to the bypass gas supply line 230 and supply the diverted process gas to the calibration tank 210.

The controller 250 may control the temperature of the calibration tank 210 by controlling the temperature control means 215.

The controller 250 may control the exhaust means 240 to exhaust the process gas stored in the calibration tank 210 to the outside.

In addition, the controller 250 may control the cleaning means 270 to perform flushing of the calibration tank 210 and the bypass gas supply line 230.

The flow calculator 260 may select a verification time section on the basis of the changing state of the calibration tank 210, and calculate a supply flow rate of a process gas supplied through the corresponding MFC 160a, 160b, or 160c on the basis of the measured changing state of the calibration tank 210 in the verification time section.

As an example, the flow calculator 260 may calculate supply flow rate using [Equation 1] below, $$\text{flow}(sccm) = \alpha \cdot \frac{273.15}{(273.15 + C)} \cdot \frac{(V_t + V_p)}{760,000} \cdot \left(\frac{P_2 - P_1}{T_2 - T_1} - \text{Leak}\right) \quad [\text{Equation 1}]$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank.

The correction factor $\alpha$ may be the reciprocal of the gas compressibility coefficient.

The flow calculator 260 may calculate an error rate of the supply flow rate on the basis of the set supply flow rate and the calculated supply flow rate and verify the corresponding MFC 160a, 160b, or 160c.

Furthermore, the flow calculator 260 may determine whether the MFC 160a, 160b, or 160c is operating normally by verifying the MFC 160a, 160b, or 160c for each flow rate to be verified.

In particular, in the present disclosure, the supply flow verification device 200 may verify a supply flow rate of the MFC for a metal gas. In the case of a metal gas, verifying a supply flow rate is difficult due to temperature sensitivity of the metal gas and a residual gas remaining in a pipe or calibration tank.

In the present disclosure, due to a substrate processing system employing the previously described supply flow verification device, the supply flow rate of a low-flow metal gas may be verified, and reliability and reproducibility of process gas supply may be ensured through verification of the supply flow rate of a metal gas.

The present disclosure proposes a method of verifying supply control for process gas through a substrate processing system employing the above supply flow verification device. Hereinafter, a process gas supply control verification method according to the present disclosure will be described through embodiments. Since a process gas supply control verification method according to the present disclosure may be implemented through an embodiment of the substrate processing system according to the present disclosure described above, the method will be described with reference to the embodiment of the substrate processing system employing the supply flow verification device according to the present disclosure shown in FIG. 3 described above.

Figure 4:
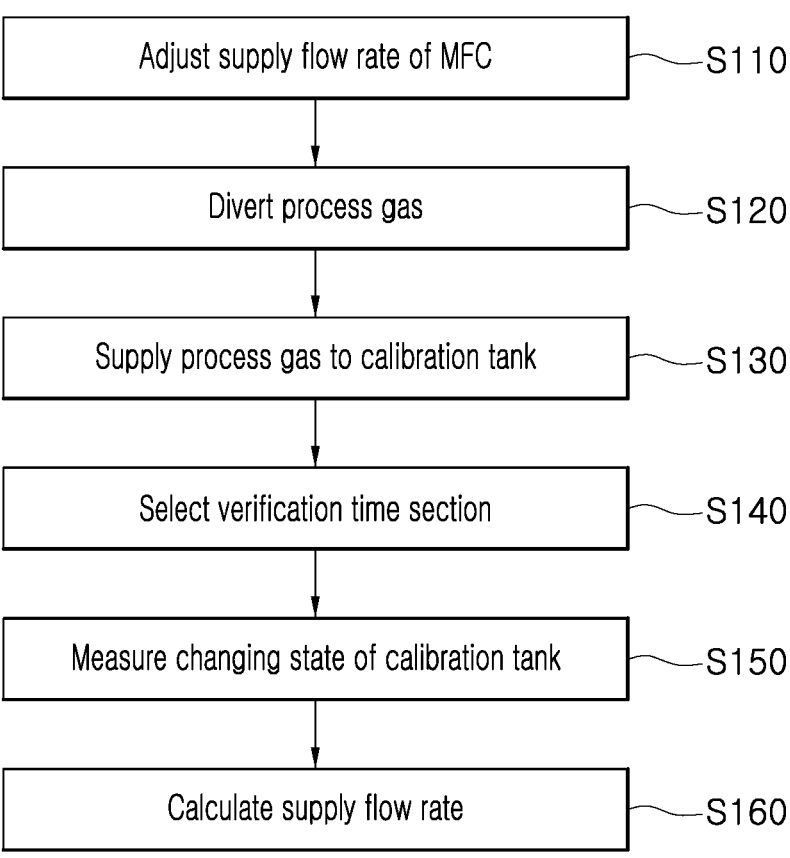
FIG. 4 shows a flowchart of an embodiment of a process gas supply control verification method according to the present disclosure.

FIG. 4 shows a flowchart of an embodiment of a process gas supply control verification method according to the present disclosure.

A process gas is supplied to the process gas supply line 130 by adjusting (S110) a supply flow rate of the MFC 160a, 160b, or 160c subject to verification.

The supply flow verification device 200 may divert (S120) a process gas supplied through the process gas supply line 130 and supply the diverted process gas to the bypass gas supply line 230. The bypass gas supply line 230 may supply (S130) the process gas to the calibration tank 210.

As the process gas is supplied to the calibration tank 210, the condition of the calibration tank 210 changes, and while the changing state of the calibration tank 210 is measured by the measuring instrument 220, the flow calculator 260 may select (S140) a verification time section.

The flow calculator 260 may extract (S150) changing state measurements of the calibration tank 210 measured by the measuring instrument 220 in the verification time section, and calculate (S160) the supply flow rate for the process gas on the basis of the changing state measurements of the calibration tank 210.

On the basis of the calculated supply flow rate, the flow calculator 260 may determine whether the MFC 160a, 160b, or 160c subject to verification adjusts the supply flow rate to match the required supply flow rate.

FIG. 5 shows a flowchart of an embodiment of verifying a mass flow controller through repetitive supply flow calculation in a process gas supply control verification method according to the present disclosure.

Figure 6:
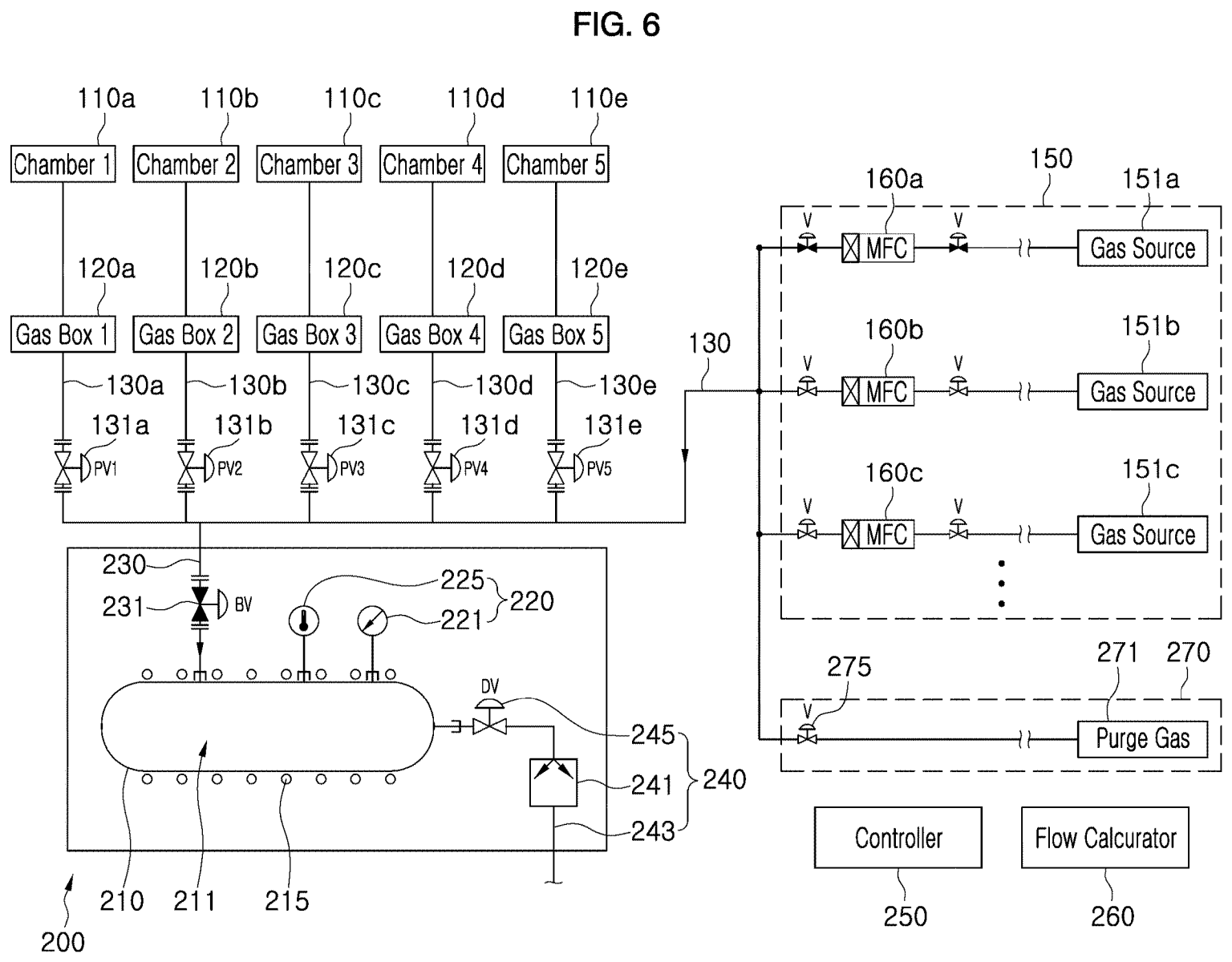

FIG. 6 shows an example of an operation for calculating a supply flow rate by bypass supplying process gas to a calibration tank in a process gas supply control verification method according to the present disclosure.

Referring to FIG. 6, the controller 250 may select the MFC 160a to be verified among the plurality of MFCs 160a, 160b, and 160c, and adjust (S211) the supply flow rate of the selected MFC 160a according to the supply flow rate to be verified.

Before supplying a process gas to the calibration tank 210, the controller 250 controls the temperature control means 215 to adjust (S213) the temperature of the calibration tank 210 and maintain the temperature in the set temperature range. In this case, the set temperature range may be set according to the type of process gas, temperature conditions required in the corresponding substrate processing process, etc.

As an example, when the process gas is a metal gas, it is necessary to supply the metal gas in a state where a certain level of temperature conditions are met because a metal gas is sensitive to temperature. Accordingly, in the present disclosure, in measuring the supply flow rate of a metal gas, first, the temperature of the calibration tank 210 is set to a predetermined temperature range, and the metal gas may be supplied to the calibration tank 210 while the predetermined temperature range is maintained.

While supplying a process gas to the process gas supply line 130 by adjusting a supply flow rate through the MFC 160a subject to verification, by diverting the process gas to the bypass gas supply line 230, the process gas may be supplied (S215) to the calibration tank 210.

For example, the controller 250 may control the gas supply control valves 131a, 131b, 131c, 131d, and 131e of the individual process gas supply lines 130a, 130b, 130c, 130d, and 130e connected to the process gas supply line 130 to shut off the supply of a process gas to the individual process gas supply lines 130a, 130b, 130c, 130d, and 130e. The controller 250 may control the bypass control valve 231 to divert the process gas supplied through the process gas supply line 130 to the bypass gas supply line 230 and supply the diverted process gas to the calibration tank 210.

As the process gas is supplied to the calibration tank 210, the pressure of the calibration tank 210 changes, and the pressure change in the calibration tank 210 may be continuously monitored (S221) using the pressure gauge 221 of the measuring instrument 220.

In the section where the pressure of the calibration tank 210 changes linearly, a verification time section of the verification pressure range set according to the supply flow rate of the corresponding process gas may be selected (S223).

In addition, using the pressure gauge 221 and thermometer 225 of the measuring instrument 220, the pressure and temperature of the calibration tank 210 at the starting point of the verification time section may be measured (S231), and the pressure and temperature of the calibration tank 210 at the end point of the verification time section may be measured (S233).

Figure 7:
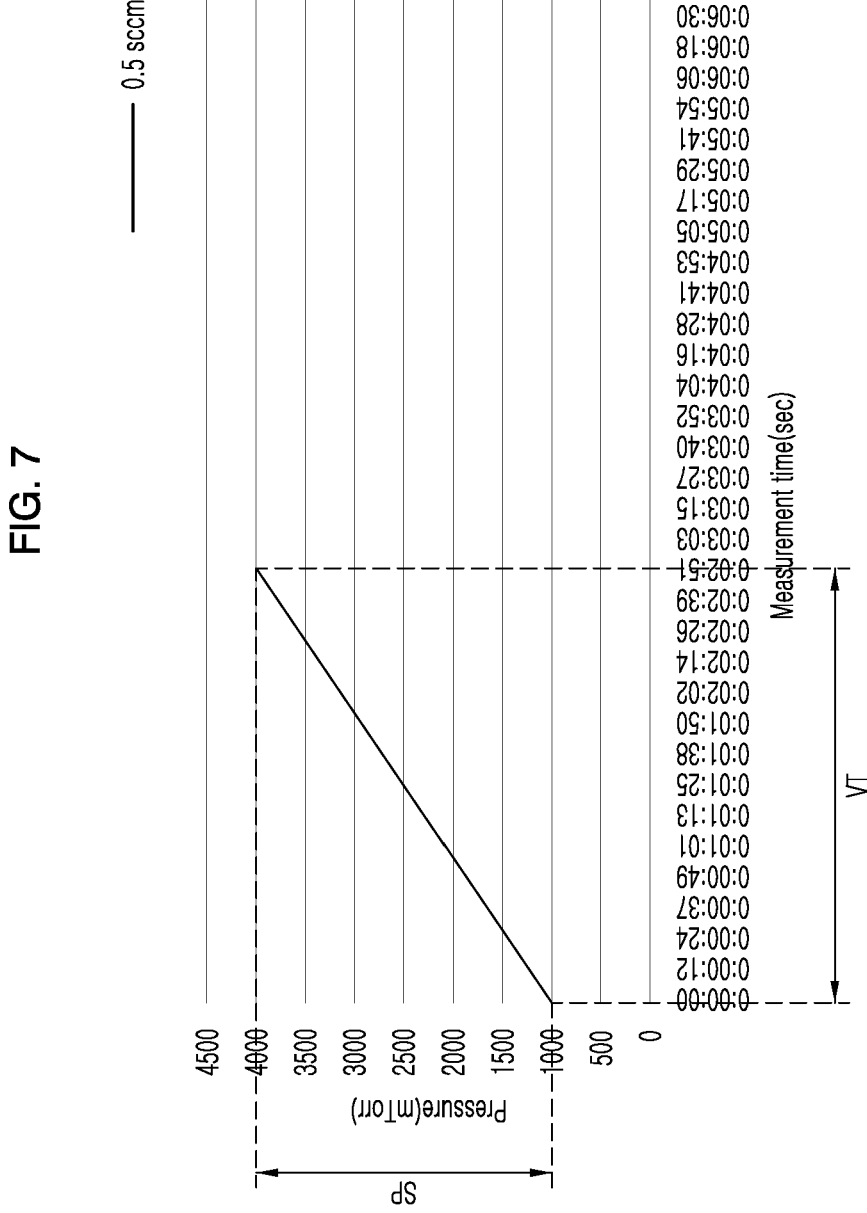
FIG. 7 shows an example of an operation for selecting a verification time section in a process gas supply control verification method according to the present disclosure.

As an example, FIG. 7 shows an example of an operation for selecting a verification time section in a process gas supply control verification method according to the present disclosure.

After setting the MFC 160a subject to verification to supply a metal gas at a low flow rate of 0.5 sccm, in a state where the MFC 160a subject to verification supplies the metal gas at a low flow rate of 0.5 sccm, pressure changes may be monitored by measuring the pressure of the calibration tank 210 with the pressure gauge 221 while the metal gas is supplied to the calibration tank 210 through the bypass gas supply line 230.

The flow calculator 260 may select a verification time section corresponding to the verification pressure range from 1 Torr to 4 Torr in the section where the pressure of the calibration tank 210 changes linearly. For example, in FIG. 7, as the pressure of the calibration tank 210 changes linearly, a pressure point of 1 Torr is selected as the start point of the verification time section, and a pressure point of 4 Torr is selected as the end point of the verification time section. For convenience in selecting the verification time section, the pressure point of 1 Torr is set as time 0, and the pressure point that changes up to 4 Torr at 02:51 is selected as the verification time section.

The flow calculator 260 may calculate (S240) the supply flow rate of the supplied process gas on the basis of measurement conditions and measurement values such as the verification time section, pressure and temperature at the start point, and pressure and temperature at the end point.

For example, in FIG. 7, measurements of pressure and temperature at point 0, which is the start of the verification time section, may be extracted, and measurements of pressure and temperature at point 02:51, which is the end of the verification time section, may be extracted. In addition, on the basis of the pressure and temperature measurements at the start of the verification time section and the pressure and temperature measurements at the end of the verification time section, a supply flow rate of the metal gas supplied through the MFC 160a subject to verification may be calculated.

As an example, the flow calculator 260 may calculate supply flow rate using [Equation 1] below, $$\text{flow}(sccm) = \alpha \cdot \frac{273.15}{(273.15 + C)} \cdot \frac{(V_t + V_p)}{760{,}000} \cdot \left( \frac{P_2 - P_1}{T_2 - T_1} - \text{Leak} \right) \quad \text{[Equation 1]}$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank.

The correction factor $\alpha$ may be the reciprocal of the gas compressibility coefficient.

Since the volume of the gas storage space 211 provided inside the calibration tank 210 is set in advance, the $V_t$ may be set in advance.

$V_p$, which is the volume of the bypass gas supply line 230, may be calculated from the length and cross-sectional area of the bypass gas supply line 230 based on the installation location of the supply flow verification device 200 and the connection point with the process gas supply line 130.

Figure 8:
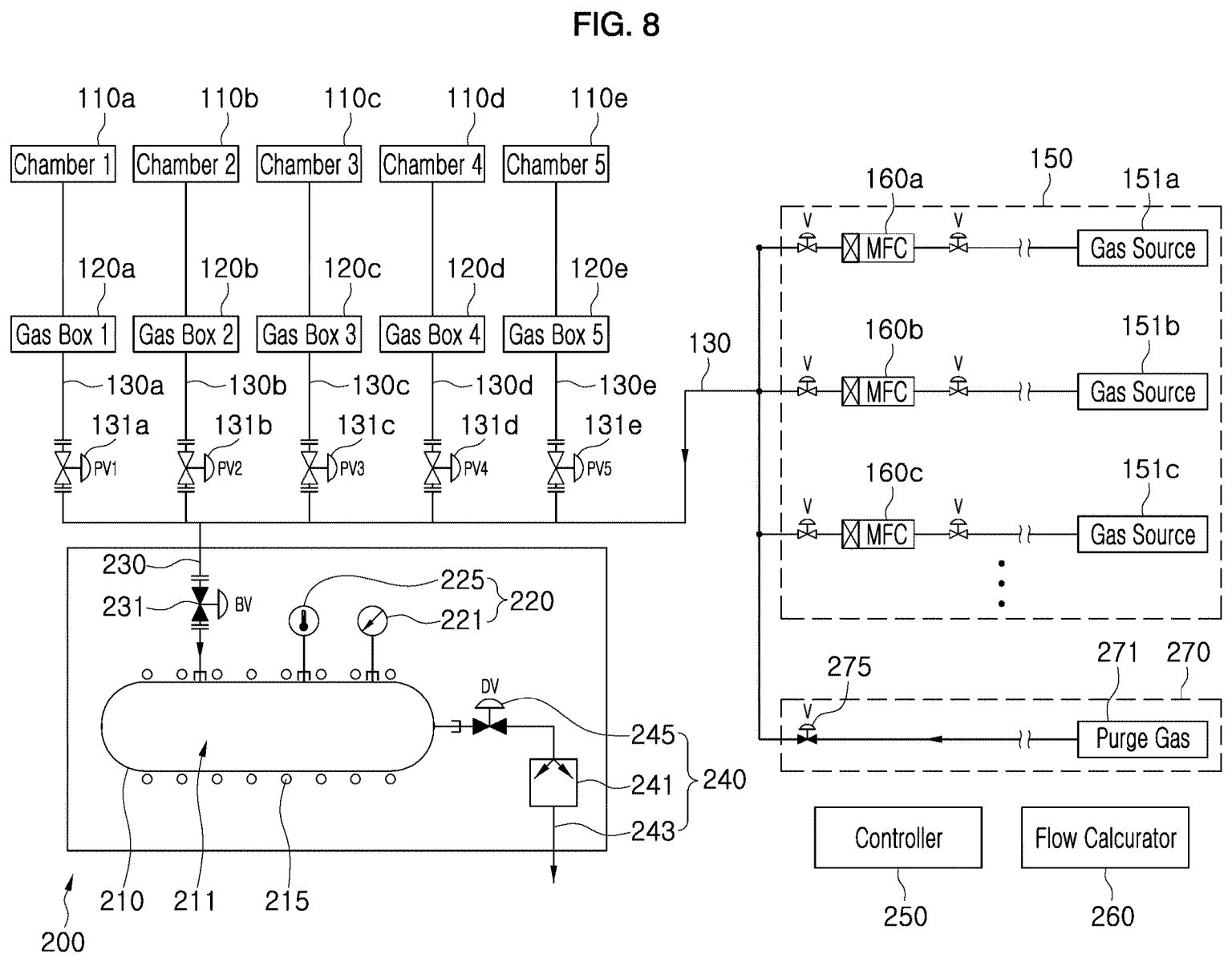

When the supply flow rate calculation by the flow calculator 260 is completed, the process gas in the calibration tank 210 may be exhausted and flushing may be performed. In this regard, FIG. 8 shows an example of cleaning a calibration tank and a bypass gas supply line in a process gas supply control verification method according to the present disclosure.

When the supply flow rate calculation by the flow calculator 260 is completed, the controller 250 may control the exhaust means 240 to exhaust the process gas stored in the calibration tank 210 to the outside. The controller 250 may control the cleaning means 270 to perform flushing (S250) of the calibration tank 210, the bypass gas supply line 230, the process gas supply line 130, etc. Flushing may also be performed together with exhaustion of the calibration tank 210.

The cleaning means 270 supplies an inert purge gas, and while the purge gas is supplied by the purge gas source part 271, the controller 250 may control the purge gas control valve 275 to supply the purge gas to the process gas supply line 130.

The controller 250 may control the bypass control valve 231 to divert the purge gas supplied through the process gas supply line 130 to the bypass gas supply line 230 and supply the diverted purge gas to the calibration tank 210.

As the purge gas is supplied, a process gas and foreign substances remaining in the calibration tank 210, the bypass gas supply line 230, and the process gas supply line 130 may be removed. The controller 250 may control the exhaust means 240 to discharge the process gas, purge gas, foreign substances, etc. resulting from flushing to the outside.

For more accurate calculation of supply flow rate, process gas supply through the MFC 160a subject to verification and calculation of the supply flow rate may be performed repeatedly for a set number of verification times.

The flow calculator 260 determines (S250) whether the number of verifications is met, and if the number of verifications is insufficient, the process described above may be repeatedly performed to calculate a supply flow rate. In this case, the number of verifications may be selected considering the type of process gas, set supply flow rate, etc.

When the number of verifications is met, the flow calculator 260 may calculate (S270) an error rate for the supply flow rate by comparing the set supply flow rate and the repeatedly calculated supply flow rate.

The flow calculator 260 may verify the MFC 160a subject to verification on the basis of the calculated error rate.

Figure 9:
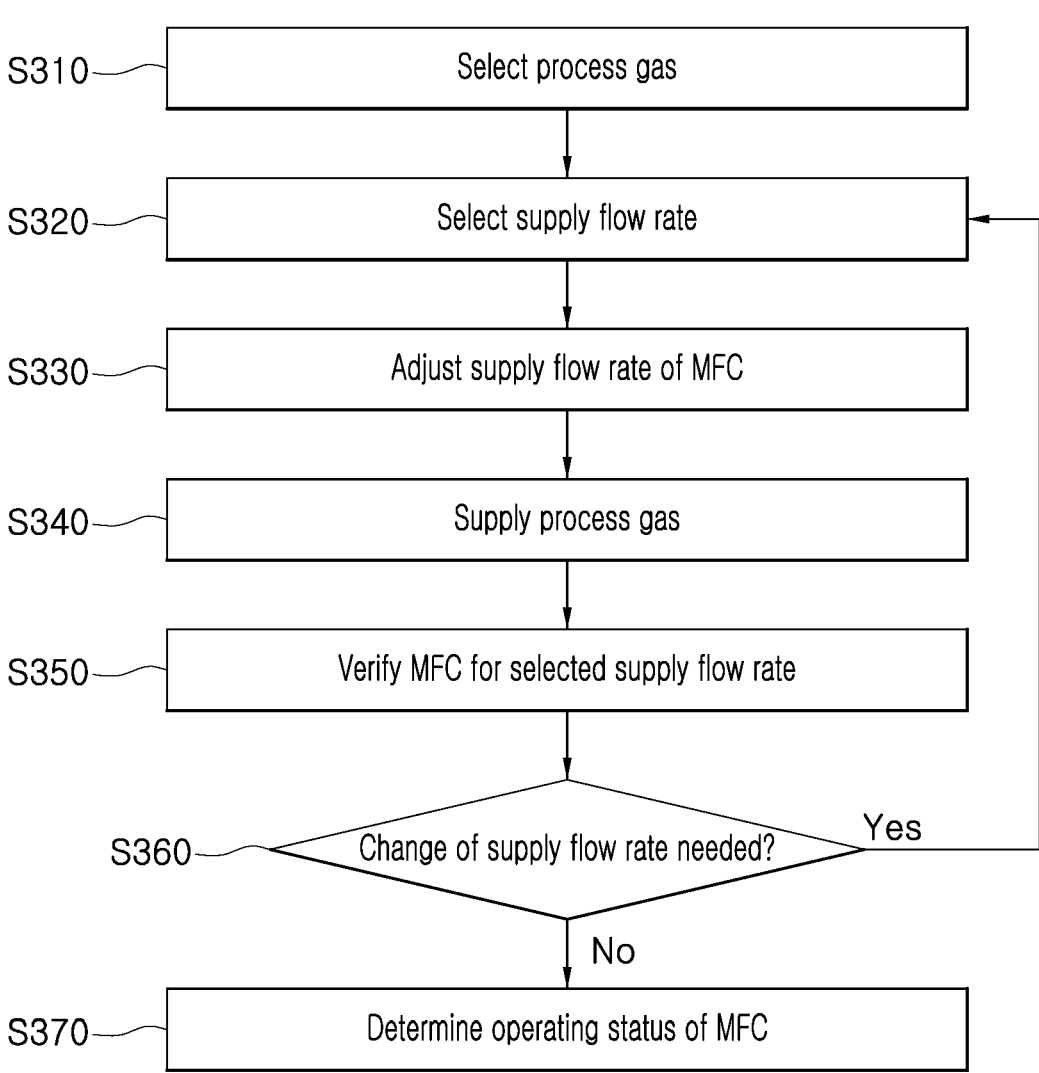
FIG. 9 shows a flowchart of an embodiment of determining an operating status of a mass flow controller by changing supply flow rates in a process gas supply control verification method according to the present disclosure.

Furthermore, by performing verification on various supply flow rates, the operating status of the MFCs may be determined. In this regard, FIG. 9 shows a flowchart of an embodiment of determining an operating status of a mass flow controller by changing supply flow rates in a process gas supply control verification method according to the present disclosure.

In describing the present embodiment, the embodiments of FIGS. 5 to 8 described above will be referred to together, and the description of overlapping parts will be omitted or briefly explained.

After a process gas to be supplied by the MFC 160a subject to verification is selected (S310), one supply flow rate among a plurality of supply flow rates subject to verification is selected (S320), and the MFC 160a subject to verification may adjust (S330) the supply flow rate of the process gas according to the selected supply flow rate to supply the process gas.

The MFC 160a subject to verification adjusts the supply flow rate of the process gas to supply (S340) the process gas, and the MFC 160a may be verified (S350) for the supply flow rate selected through the process described above.

The flow calculator 260 may determine (S360) whether to change supply flow rates after verifying the MFC 160a subject to verification for a specific supply flow rate. By selecting (S320) a different supply flow rate and repeatedly performing the above process, the MFC 160a subject to verification may be verified for each supply flow rate.

Figure 10:
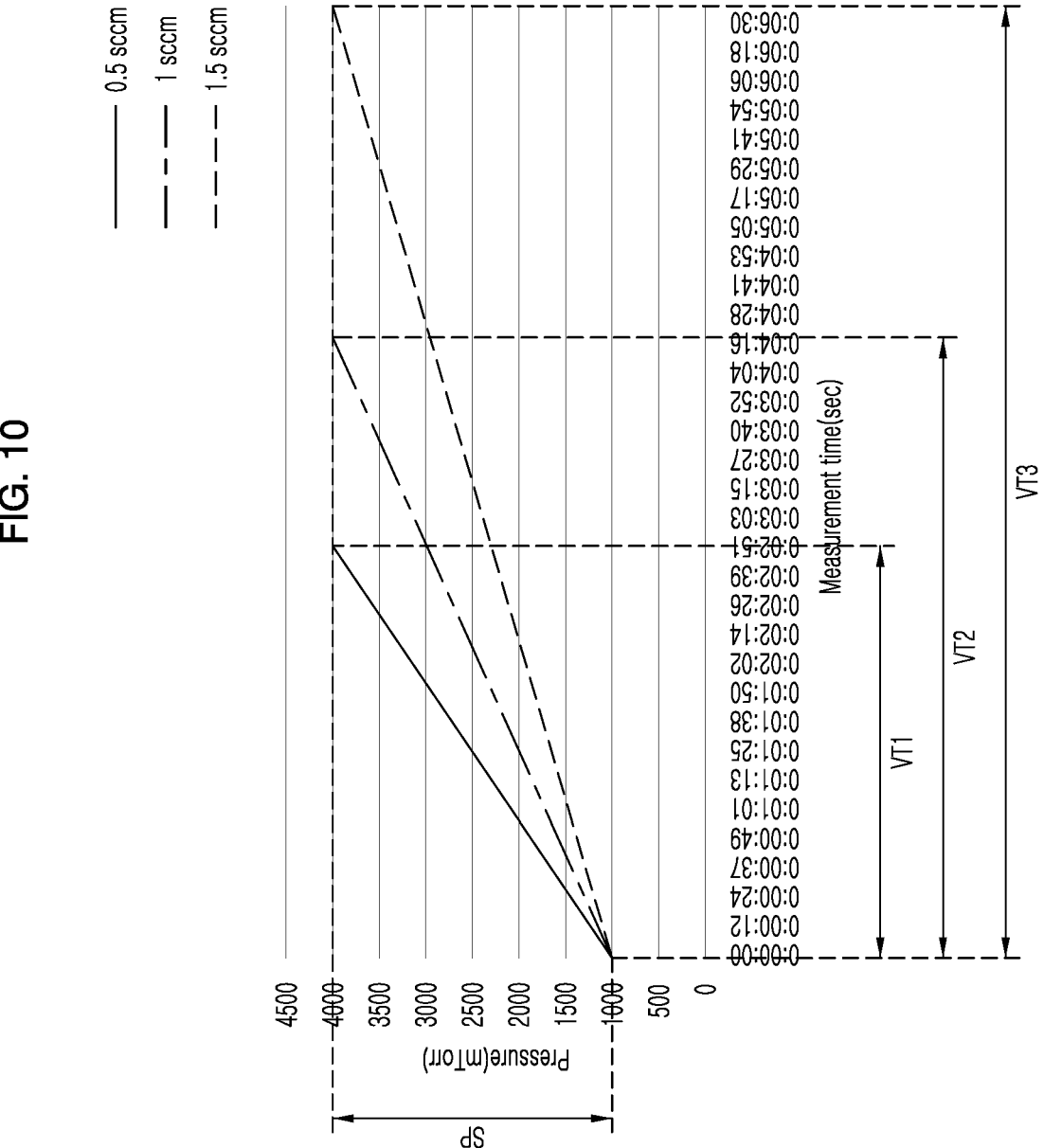
FIG. 10 shows an example of selecting a verification time section for each supply flow rate in a process gas supply control verification method according to the present disclosure.

FIG. 10 shows an example of selecting a verification time section for each supply flow rate in a process gas supply control verification method according to the present disclosure.

Referring to FIG. 10, after setting the supply flow rate of the MFC 160a subject to verification to 0.5 sccm, a verification time section VT1 corresponding to a verification pressure range SP is selected, and a supply flow rate is calculated on the basis of the pressure and temperature measurements for the calibration tank 210 in the verification time section VT1. On the basis of the calculated supply flow rate, the MFC 160a subject to verification may be verified for the supply flow rate of 0.5 sccm.

After sequentially changing and setting the supply flow rate of the MFC 160a subject to verification to 0.1 sccm and 1.5 sccm, and selecting verification time sections VT2 and VT3 corresponding to the verification pressure range SP, respective supply flow rates may be calculated on the basis of the pressure and temperature measurements for the calibration tank 210 in the verification time sections VT2 and VT3. On the basis of the calculated supply flow rates, the MFC 160a subject to verification may be verified for the supply flow rates of 1.0 sccm and 1.5 sccm.

The flow calculator 260 may determine (S370) the operating status of the MFC 160a subject to verification by verifying the MFC 160a subject to verification for each supply flow rate.

According to the present disclosure, a supply flow rate of a mass flow controller (MFC) may be verified for low flow process gases, especially a metal gas. Furthermore, it is not easy to accurately measure a supply flow rate of a mass flow controller through a conventional chamber, and a fairly long time is required for precise verification. However, in the present disclosure, after selecting a section where a flow rate can be calculated in a section where pressure changes linearly in response to the type and flow rate of a relevant process gas, a supply flow rate is calculated on the basis of measurements of a changing state of a calibration tank in the corresponding section, and thus accurate flow rate calculation is possible in a short time.

The above description is merely illustrative of the technical idea of the present disclosure, and various modifications and variations may be made by those skilled in the art to which the present disclosure pertains without departing from the essential characteristics of the present disclosure. Therefore, the embodiments described in the present disclosure are not intended to limit the technical spirit of the present disclosure, but to explain, and the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. A process gas supply control verification method, the method comprising:
 a process gas supply step of supplying a process gas by adjusting a supply flow rate of the process gas with a mass flow controller, and supplying the process gas to a calibration tank through a bypass gas supply line;
 a verification section selection step of selecting a verification time section while changing a state of the calibration tank through process gas supply;

15 a changing state measurement step of measuring the changing state of the calibration tank in the verification time section; and a supply flow rate calculation step of calculating a supply flow rate of the process gas on the basis of the measurement of the changing state of the calibration tank, wherein the process gas is a metal gas, wherein the verification section selection step includes controlling diversion of the metal gas to the calibration tank and selecting the verification time section set in response to a supply flow rate of the metal gas in a pressure section of the calibration tank that changes linearly while the calibration tank is maintained at a controlled temperature, and wherein in the supply flow rate calculation step, the supply flow rate is calculated using [Equation 1] below, $$\text{flow}(sccm) = \alpha \cdot \frac{273.15}{(273.15 + C)} \cdot \frac{(V_t + V_p)}{760,000} \cdot \left( \frac{P_2 - P_1}{T_2 - T_1} - \text{Leak} \right) \quad \text{[Equation 1]}$$

wherein flow represents the supply flow rate of the process gas, $\alpha$ represents a correction factor, C represents temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank.

2. The method of claim 1, wherein in the verification section selection step, a verification time section of a verification pressure range is selected in a section where pressure in the calibration tank changes linearly according to the process gas supply.

3. The method of claim 1, wherein in the changing state measurement step, pressure and temperature of the calibration tank are measured in the verification time section.

4. The method of claim 1, wherein in the supply flow rate calculation step, the supply flow rate of the process gas supplied through the mass flow controller is calculated considering volume of the calibration tank and a volume of the bypass gas supply line on the basis of a pressure change and a temperature change in the calibration tank at start and end points of the verification time section.

5. The method of claim 4, wherein the volume of the bypass gas supply line is calculated on the basis of pressure and temperature of the process gas supplied through the bypass gas supply line.

6. The method of claim 1, wherein in the process gas supply step, the process gas is supplied to the calibration tank while a temperature of the calibration tank is controlled through a temperature control means and maintained at a set temperature.

7. The method of claim 1, wherein in the process gas supply step, the process gas supplied to a process gas supply line connected to a selected process chamber among a plurality of process chambers is diverted to the bypass gas supply line and supplied to the calibration tank.

8. The method of claim 1, wherein in the process gas supply step, the process gas supplied through a mass flow controller selected from among a plurality mass flow controllers connected to a plurality of gas source parts is diverted to the bypass gas supply line and supplied to the calibration tank.

9. The method of claim 1, further comprising:
a cleaning step of supplying a purge gas to the bypass gas supply line to flush the bypass gas supply line and the calibration tank.

10. The method of claim 9, further comprising:
a mass flow controller verification step of repeatedly performing the process gas supply step to the cleaning step to calculate an error rate for the supply flow rate and verify the mass flow controller.

11. The method of claim 10, further comprising:
a mass flow controller operation determination step of performing the process gas supply step and the mass flow controller verification step by changing the supply flow rate to be verified to verify the mass flow controller for each supply flow rate to be verified and determine whether the mass flow controller supplies the process gas at a verified supply flow rate corresponding to a set supply flow rate.

12. A process gas supply control verification method, the method comprising:
a process gas supply step of supplying a metal gas by adjusting a supply flow rate of the metal gas to a supply flow rate to be verified through a mass flow controller, and supplying the metal gas to a calibration tank through a bypass gas supply line;

a verification section selection step of detecting pressure changes while increasing pressure of the calibration tank through metal gas supply, and selecting a verification time section of a verification pressure range set in response to the supply flow rate to be verified in a pressure section that changes linearly;

a flow rate calculation step of calculating a supply flow rate of the metal gas by substituting pressure measurements and a temperature measurement in the verification time section into [Equation 1] below, $$\text{flow}(sccm) = \alpha \cdot \frac{273.15}{(273.15 + C)} \cdot \frac{(V_t + V_p)}{760,000} \cdot \left( \frac{P_2 - P_1}{T_2 - T_1} - \text{Leak} \right) \quad \text{[Equation 1]}$$

wherein flow represents a supply flow rate of a process gas, $\alpha$ represents a correction factor, C represents a temperature of the calibration tank, $V_t$ represents volume of the calibration tank, $V_p$ represents volume of the bypass gas supply line, $P_1$ represents pressure of the calibration tank at the start of the verification time section, $P_2$ represents pressure of the calibration tank at the end of the verification time section, $T_1$ represents start time of the verification time section, $T_2$ represents end time of the verification time section, and Leak represents an amount of process gas leakage from the calibration tank;

a cleaning step of supplying a purge gas to the bypass gas supply line to flush the bypass gas supply line and the calibration tank;

a mass flow controller verification step of repeatedly performing the process gas supply step to the cleaning step to calculate an error rate for the supply flow rate and verify the mass flow controller; and a mass flow controller operation determination step of performing the process gas supply step and the mass flow controller verification step by changing the supply flow rate to be verified to verify the mass flow controller for each supply flow rate to be verified and determine whether the mass flow controller operates normally.

* * * * *